(12) United States Patent
Pu et al.

(10) Patent No.: US 12,058,807 B2
(45) Date of Patent: Aug. 6, 2024

(54) CIRCUIT BOARD AND ELECTRONIC DEVICE

(71) Applicants: Chengdu BOE Optoelectronics Technology Co., Ltd., Sichuan (CN); BOE Technology Group Co., Ltd., Beijing (CN)

(72) Inventors: Qianlin Pu, Beijing (CN); Fei Li, Beijing (CN); Zijian Wang, Beijing (CN); Xu Lu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 177 days.

(21) Appl. No.: 17/799,917

(22) PCT Filed: Nov. 16, 2021

(86) PCT No.: PCT/CN2021/130803
§ 371 (c)(1),
(2) Date: Aug. 15, 2022

(87) PCT Pub. No.: WO2022/179196
PCT Pub. Date: Sep. 1, 2022

(65) Prior Publication Data
US 2023/0345619 A1    Oct. 26, 2023

(30) Foreign Application Priority Data
Feb. 25, 2021   (CN) .......................... 202110215290.1

(51) Int. Cl.
*H05K 1/02*   (2006.01)
*H05K 1/14*   (2006.01)

(52) U.S. Cl.
CPC ........... *H05K 1/0218* (2013.01); *H05K 1/028* (2013.01); *H05K 1/144* (2013.01); *H05K 2201/043* (2013.01)

(58) Field of Classification Search
CPC ...... H05K 1/0218; H05K 1/028; H05K 1/144; H05K 2201/043
(Continued)

(56) References Cited

U.S. PATENT DOCUMENTS

2009/0168363 A1\* 7/2009 Clayton ................. H05K 1/189
29/840
2012/0262886 A1\* 10/2012 Yamagishi ........... H05K 1/0268
361/749

(Continued)

FOREIGN PATENT DOCUMENTS

CN    207995488 U    10/2018
CN    109496063 A     3/2019
(Continued)

OTHER PUBLICATIONS

International Search Report for PCT/CN2021/130803 Mailed Feb. 9, 2022.

*Primary Examiner* — Andargie M Aychillhum
(74) *Attorney, Agent, or Firm* — Ling Wu; Stephen Yang; Ling and Yang Intellectual Property

(57) ABSTRACT

A circuit board and an electronic device, the circuit board includes a first wiring board including a first substrate and a first wiring layer disposed on a first side surface of the first substrate, and the first wiring layer includes a first ground wiring; the circuit board further includes a first protective layer and a first electromagnetic interference shielding layer sequentially stacked on a side of the first wiring layer away from the first substrate; the first protective layer has a first opening exposing at least a portion of a first ground wiring, the first opening is filled with a first conductive material, (Continued)

height difference between a surface of the first conductive material and a surface of the first protective layer away from the first substrate ranges from 0 to 2 microns, and the first conductive material connects the first electromagnetic interference shielding layer to the first grounding wiring.

12 Claims, 3 Drawing Sheets

(58) Field of Classification Search
USPC .......................................................... 361/749
See application file for complete search history.

(56) References Cited

U.S. PATENT DOCUMENTS

| 2020/0367393 | A1 | 11/2020 | Mun et al. |
| 2022/0256690 | A1 | 8/2022 | Gong |

FOREIGN PATENT DOCUMENTS

| CN | 111465175 A | 7/2020 |
| CN | 112822834 A | 5/2021 |

* cited by examiner

CIRCUIT BOARD AND ELECTRONIC DEVICE

CROSS-REFERENCE TO RELATED APPLICATIONS

The present application is a U.S. National Phase Entry of International Application PCT/CN2021/130803 having an international filing date of Nov. 16, 2021, which claims the priority of the Chinese patent application No. 202110215290.1, entitled "Circuit Board and Electronic Device", filed to the CNIPA on Feb. 25, 2021, and the contents disclosed in the above-mentioned application are hereby incorporated as a part of this application.

TECHNICAL FIELD

The embodiments of the present disclosure relate to, but are not limited to, the technical field of electronic devices, in particular to a circuit board and an electronic device.

BACKGROUND

At present, electronic products are used more and more widely in our lives, and a circuit board is an important part of electronic products. In some technologies, in order to achieve grounding and electromagnetic shielding of a circuit board, it is necessary to perforate a capping layer covering a wiring layer to expose a ground wiring of the wiring layer to connect with an electromagnetic interference shielding film or a conductive layer. However, it will cause local tilting and uneven problems on the circuit board.

SUMMARY

The following is a summary of subject matter described herein in detail. The summary is not intended to limit the protection scope of claims.

An embodiment of the present disclosure provides a circuit board, including a first wiring board, wherein the first wiring board includes a first substrate and a first wiring layer disposed on a first side surface of the first substrate, and wherein the first wiring layer includes a first ground wiring; the circuit board further includes a first protective layer and a first electromagnetic interference shielding layer which are sequentially stacked on a side of the first wiring layer away from the first substrate; and the first protective layer is provided with a first opening, the first opening exposes at least a portion of a first ground wiring, the first opening is filled with a first conductive material, a height difference between a surface of the first conductive material and a surface of the first protective layer away from the first substrate is from 0 micron to 2 microns, and the first conductive material connects the first electromagnetic interference shielding layer to the first grounding wiring.

An embodiment of the present disclosure further provides an electronic device, including the circuit board as described above by any of the embodiments.

Other aspects may be understood upon reading and understanding the drawings and the detailed description.

BRIEF DESCRIPTION OF DRAWINGS

The accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure. Shapes and sizes of various components in the drawings do not reflect actual scales, and are only intended to schematically illustrate the contents of the present disclosure.

DETAILED DESCRIPTION

Those of ordinary skills in the art should understand that modifications or equivalent replacements may be made to the technical solutions of the embodiments of the present disclosure without departing from the spirit and scope of the technical solutions of the embodiments of the present disclosure, and should all fall within the scope of the claims of the present disclosure.

Figure 1A:
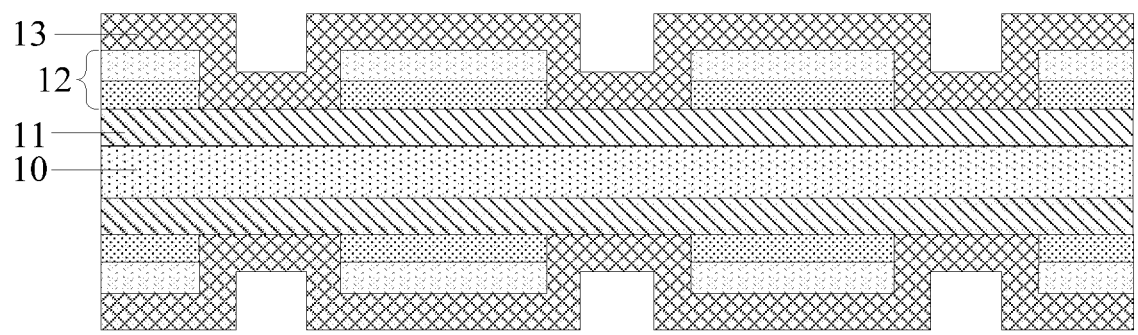
FIG. 1a is a schematic diagram of a cross-sectional structure of a circuit board in some technologies.
Figure 1B:
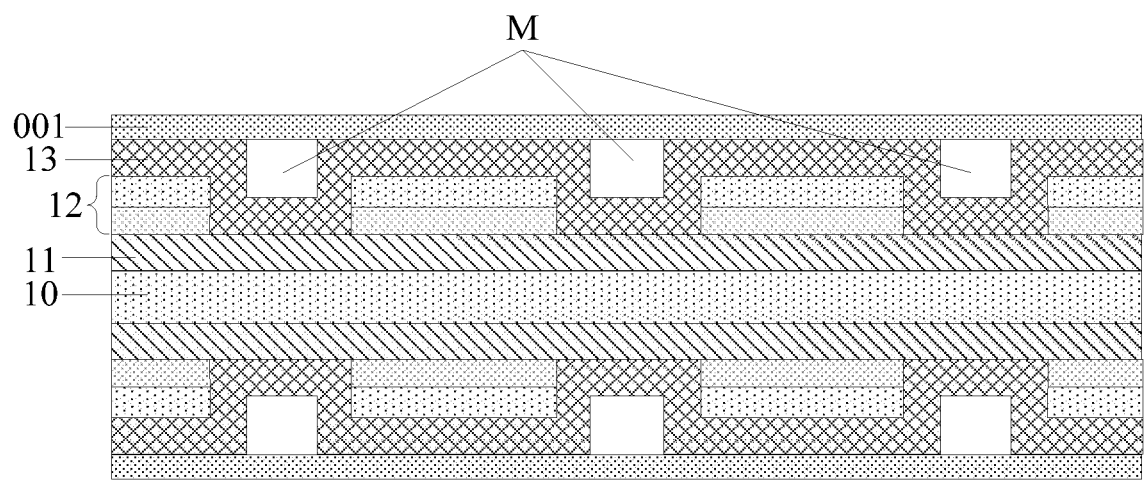
FIG. 1B is a schematic diagram of a structure of the circuit board of FIG. 1a after a double-sided adhesive tape is attached.

In some technologies, as shown in FIG. 1a, FIG. 1a is a schematic diagram of cross-sectional structures of some circuit boards. Since the circuit board needs to have a high electromagnetic shielding ability and a signal anti-interference ability, an electromagnetic interference shielding film 13 (EMI film for short) is attached to a surface of the circuit board. By perforating a cover film 12 (CVL for short) of the circuit board, the EMI film 13 is connected to a ground wiring of a wiring layer 11 (the wiring layer is disposed on a substrate 10), which achieves electromagnetic shielding function of the EMI film 13. In this grounding mode, a local segment difference (height difference) is formed at the grounding position of the EMI film 13 due to opening of the cover film 12. In one aspect, as shown in FIG. 1a, since current consumer electronic products have higher shielding requirements on circuit boards, the number of grounding points of the EMI film 13 on the circuit board is large with a small area, which results in an uneven surface of the circuit board, and the segment difference cannot be filled from the outer surface of the EMI film 13. In this case, as shown in FIG. 1B, FIG. 1B is a schematic diagram of a structure of the circuit board of FIG. 1a after a double-sided adhesive tape is attached, When a thin double-sided adhesive tape 001 or another adhesive layer is attached to the surface of the circuit board (i.e., the outer surface of the EMI film 13), due to the uneven surface of the circuit board, there will be bubbles and trapped air at the position M corresponding to the opening of the covering film 12 between the double-sided tape 001 and the EMI film 13, which results in that the trapped air and bubbles cause deformation of local material, thus leading to a poor film printing when the circuit board is attached to the back of a flexible organic light emitting diode (OLED) screen by the double-sided tape 001. In another aspect, because there is a segment difference in the perforated area of the cover film 12, after the EMI film 13 is attached, the circuit board (for example, when the circuit board is a flexible circuit board) in the perforating area will be upwrapped due to pulling of stress, which will affect the assembly of the module.

An embodiment of the present disclosure provides a circuit board, including a first wiring board, wherein the first wiring board includes a first substrate and a first wiring layer disposed on a first side surface of the first substrate. The first wiring layer includes a first ground wiring. The circuit board further includes a first protective layer and a first electromagnetic interference shielding layer which are sequentially stacked on a side of the first wiring layer away from the first substrate. The first protective layer is provided with a first opening, wherein the first opening exposes at least a portion of a first ground wiring, the first opening is filled with a first conductive material, the height difference between a surface of the first conductive material and a surface of the first protective layer away from the first substrate is from 0 micron to 2 microns, and the first conductive material connects the first electromagnetic interference shielding layer and the first grounding wiring.

According to the circuit board of the embodiment of the present disclosure, the first conductive material is filled within the first opening of the first protective layer and the height difference between the surface of the first conductive material and the surface of the first protective layer away from the first substrate is from 0 micron to 2 microns, therefore, in one aspect, the first conductive material fills the segment difference at the first opening of the first protective layer, ensuring that the surface of the first protective layer is flat and a thickness of the circuit board is not increased. After the first electromagnetic interference shielding layer is attached to the first protective layer, a surface of the first electromagnetic interference shielding layer is also flat. Thus air bubbles or trapped air will not be generated between the first electromagnetic interference shielding layer and a double-sided adhesive tape or other adhesive layers, when they are attached to the first electromagnetic interference shielding layer, so that when the circuit board is attached to the back of the flexible OLED screen by the double-sided adhesive tape or other adhesive layers, poor film printing will not be caused. In another aspect, the first conductive material fills the segment difference at the first opening of the first protective layer, and after the first electromagnetic interference shielding layer is subsequently attached to the first protective layer, a stress balance of the circuit board (for example, when the circuit board is a flexible circuit board) may be achieved at the first opening to prevent the circuit board from up-wrapping. In addition, the first conductive material connects the first electromagnetic interference shielding layer to the first ground wiring, so that a shielding function of the first electromagnetic interference shielding layer can be achieved.

According to the circuit board of the embodiment of the present disclosure, the height difference between the surface of the first conductive material and the surface of the first protective layer away from the first substrate is from 0 micron to 2 microns. That is, the surface of the first conductive material may be flush with the surface of the first protective layer away from the first substrate, or the surface of the first conductive material may be higher or lower than the surface of the first protective layer away from the first substrate by 0 micron to 2 microns.

The circuit board of the embodiment of the present disclosure may be a flexible printed circuit (FPC), a printed circuit board (PCB), or a rigid flex printed circuit board (RFPC), and the type of the circuit board is not limited in the embodiment of the present disclosure.

The circuit board of the embodiment of the present disclosure may be a single-sided circuit board, a double-sided circuit board or a multi-layer circuit board, and the number of wiring layers may be one or more, which is not limited in the embodiment of the present disclosure.

Figure 2:
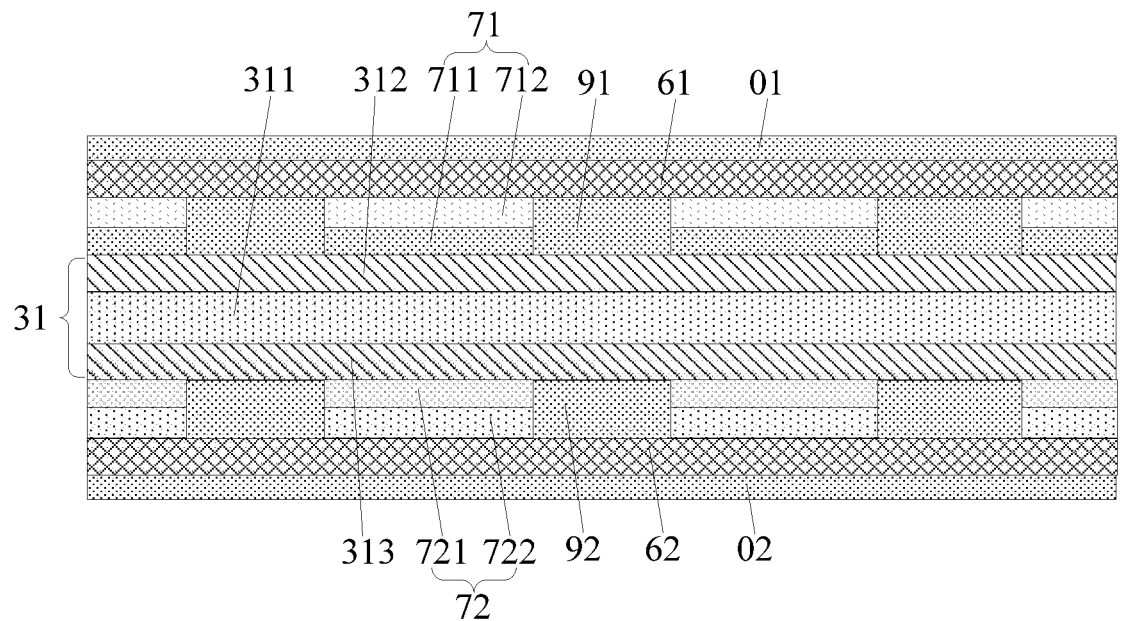
FIG. 2 is a schematic diagram of a cross-sectional structure of a circuit board according to some exemplary embodiments.

In some exemplary embodiments, as shown in FIG. 2, FIG. 2 is a schematic diagram of a cross-sectional structure of a circuit board according to some exemplary embodiments. The circuit board includes a first wiring board 31, wherein the first wiring board 31 includes a first substrate 311 and a first wiring layer 312 disposed on a first side surface of the first substrate 311. The first wiring layer 312 includes a first ground wiring. The circuit board further includes a first protective layer 71 and a first electromagnetic interference shielding layer 61 which are sequentially stacked on a side of the first wiring layer 312 away from the first substrate 311. The first protective layer 71 is provided with a first opening, wherein the first opening exposes at least a portion of the first ground wiring, the first opening is filled with a first conductive material 91, a height difference between a surface of the first conductive material 91 and a surface of the first protective layer 71 away from the first substrate 311 is from 0 micron to 2 microns (the height difference is 0 micron in the example of FIG. 2, and that is, the surface of the first conductive material 91 is flush with the surface of the first protective layer 71 away from the first substrate 311), and the first conductive material 91 connects the first electromagnetic interference shielding layer 61 to the first ground wiring.

In this embodiment, the first wiring board 31 may further include a second wiring layer 313 disposed on a second side surface of the first substrate 311, wherein the second wiring layer 313 includes a second ground wiring. The circuit board may further include a second protective layer 72 and a second electromagnetic interference shielding layer 62 which are sequentially stacked on a side of the second wiring layer 313 away from the first substrate 311. The second protective layer 72 is provided with a second opening, wherein the second opening exposes at least a portion of the second ground wiring, the second opening is filled with a second conductive material 92, a height difference between a surface of the second conductive material 92 and a surface of the second protective layer 72 away from the first substrate 311 is from 0 micron to 2 microns, and the second conductive material 92 connects the second electromagnetic interference shielding layer 62 and the second grounding wiring.

In an example of this embodiment, as shown in FIG. 2, the first protective layer 71 may be provided with one or more first openings, and the shape of the first openings may be rectangular, circular, polygonal, irregular, etc. This embodiment is not limited to the number and shape of the first openings. In an example of this embodiment, a material of the first substrate 311 may be Polyimide (PI), polyether ether ketone, or polyester. A material of the first wiring layer 312 and the second wiring layer 313 may be copper. In an example of this embodiment, the first conductive material 91 may be a metal material such as any one or more of gold, silver and copper. The first conductive material 91 may be filled within the first opening by an electroplating process or a coating process. For example, metallic copper may be filled in the first opening by an electroplating process, or a point coating of silver paste may be made within the first opening by the coating process and the silver paste may be solidified to ensure that the height difference between a surface of the first conductive material 91 and a surface of the first protective layer 71 away from the first substrate 311 is from 0 micron to 2 microns. A Material and a formation of the second conductive material 92 may be the same as those of the first conductive material 91.

In an example of this embodiment, the first electromagnetic interference shielding layer 61 may be a first electromagnetic interference shielding film, which may include a protective film, a shielding functional layer and a conductive adhesive layer which are sequentially stacked on a side surface of the protective film. The first electromagnetic interference shielding film can be attached to the first protective layer 71 and contacted with the first conductive material 91 by a hot pressing process, and the shielding functional layer is connected to the first conductive material 91 by a conductive adhesive layer, so that the shielding functional layer is connected to a first ground wiring.

In an example of this embodiment, as shown in FIG. 2, the first protective layer 71 may include a first capping layer 712 and a first adhesive layer 711. The first adhesive layer 711 is located between the first capping layer 712 and the first wiring layer 312, and the first capping layer 712 is adhered to the first wiring layer 312 through the first adhesive layer 711. In an example of this embodiment, a process of forming the first protective layer 71 may include: a first covering film having a first opening is attached to a surface of a first wiring layer 312, the first covering film including a first capping layer 712 and a first adhesive layer 711 disposed on a side surface of the first capping layer 712, and the first covering film may be hot pressed on the first wiring layer 312 by a hot pressing process (laminating process), during which the first adhesive layer 711 melts and adheres the first capping layer 712 to the first wiring layer 312. After the first protective layer 71 is formed, firstly, a first conductive material 91 is filled within the first opening to fill a segment difference at the first opening of the first protective layer 71. Then, a first electromagnetic interference shielding layer 61 (the first electromagnetic interference shielding layer may be an EMI film) is attached to the first protective layer 71 and the first conductive material 91.

In an example of this embodiment, the second protective layer 72 may include a second covering film 722 and a second adhesive layer 721. The second adhesive layer 721 is located between the second covering film 722 and the third wiring layer 322. The second protective layer 72 and the second electromagnetic interference shielding layer 62 may be disposed in the same manner as the first protective layer 71 and the first electromagnetic interference shielding layer 61.

According to the circuit board of the embodiment of the present disclosure, the first conductive material 91 is filled in the first opening of the first protective layer 71 and the height difference between the surface of the first conductive material 91 and the surface of the first protective layer 71 away from the first substrate 311 is from 0 micron to 2 microns. In this way, the first conductive material 91 fills the segment difference at the first opening of the first protective layer 71, ensuring that the surface of the first protective layer 71 is flat and the thickness of the circuit board is not increased. After the first electromagnetic interference shielding layer 61 is attached to the first protective layer 71, the surface of the first electromagnetic interference shielding layer 61 is also flat. Similarly, after the second electromagnetic interference shielding layer 62 is attached to the second protective layer 72, the surface of the second electromagnetic interference shielding layer 62 is also flat. Thus, after a first double-sided adhesive tape 01 is attached to the first electromagnetic interference shielding layer 61 and a second double-sided adhesive tape 02 is attached to the second electromagnetic interference shielding layer 62, bubbles or trapped air are not generated between the first double-sided adhesive tape 01 and the first electromagnetic interference shielding layer 61, or between the second double-sided adhesive tape 02 and the second electromagnetic interference shielding layer 62, so that when the circuit board is attached to the back of the flexible OLED screen through the double-sided adhesive tape or other adhesive layers, poor film printing will not be caused. In addition, the first conductive material 91 fills the segment difference at the first opening of the first protective layer 71, and after the first electromagnetic interference shielding layer 61 is subsequently attached to the first protective layer 71, stress balance of the circuit board (for example, when the circuit board is a flexible circuit board) may be achieved at the first opening to prevent the circuit board from up-wrapping at the first opening. Similarly, after the second electromagnetic interference shielding layer 62 is subsequently attached to the second protective layer 72, stress balance of the circuit board (for example, when the circuit board is a flexible circuit board) may be achieved at the second opening to prevent the circuit board from up-wrapping at the second opening.

Figure 3:
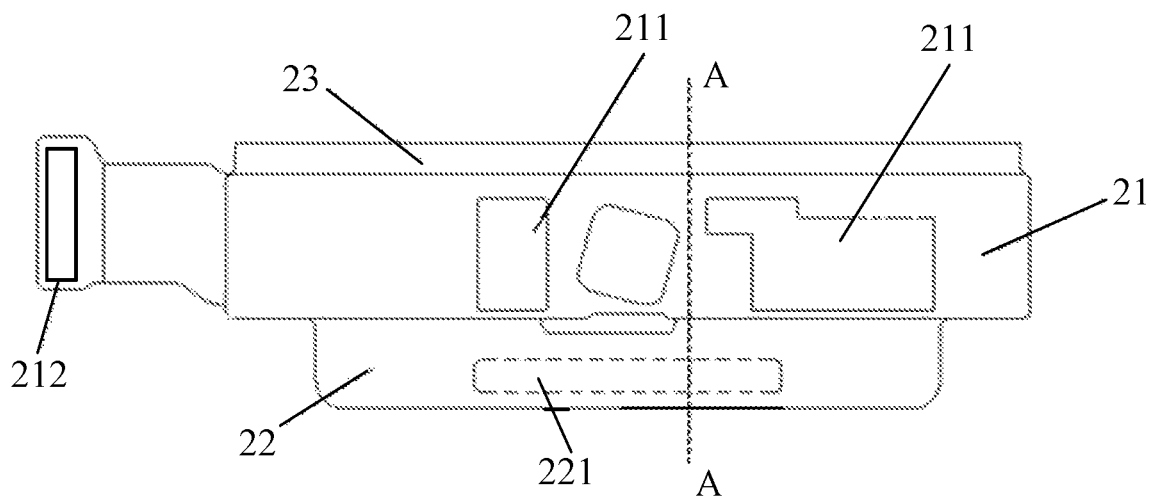
FIG. 3 is a schematic diagram of a planar structure of a circuit board according to some other exemplary embodiments.

In other exemplary embodiments, as shown in FIG. 3, FIG. 3 is a schematic diagram of a planar structure of a circuit board according to the other exemplary embodiments. The circuit board may be a rigid flex printed circuit board, and the circuit board may include a main body portion 21, a bendable portion 22 located on a first side of the main body portion 21, and a bonding portion 23 located on a second side of the main body portion 21 opposite to the first side. The main body portion 21 may include a plurality of wiring layers, a component area 211 may be provided on one surface of the main body portion 21, and components such as chips, capacitors, resistors, etc. may be provided in the component area 211. The main body portion 21 may be provided with a connector 212, wherein the connector 212 may be connected to an external circuit. The bendable portion 22 may be bent, the bendable portion 22 may be provided with a ground area 221, at least part of the ground wiring of the circuit board may be exposed by a film layer covered above a ground wiring in the ground area 221, and the at least part of the ground wiring exposed may be connected to an electromagnetic interference shielding layer of the circuit board to achieve an electromagnetic shielding function of the electromagnetic interference shielding layer. The bonding portion 23 is used for achieving bonding connection between the circuit board and the external circuit. In some examples, when the circuit board is applied to a display apparatus, the circuit board may be bonding-connected to a display panel through the bonding portion 23 and the circuit board may be connected to a motherboard of the display apparatus through the connector 212. The circuit board may also be provided with one or more openings to avoid components or structures of the display apparatus.

Figure 4:
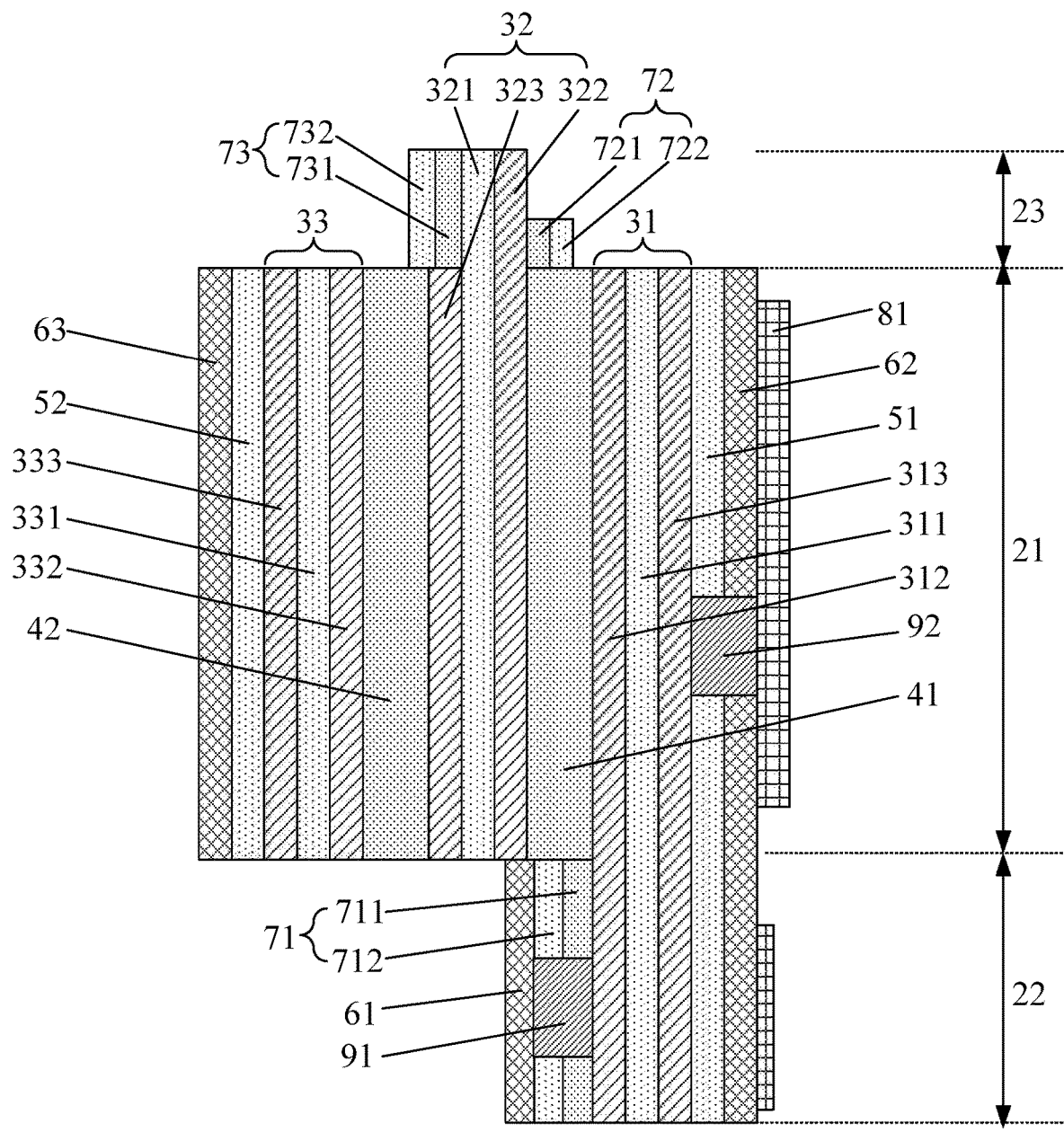
FIG. 4 is a schematic diagram of a cross-sectional structure at position A-A in FIG. 3.

In some exemplary embodiments, as shown in FIG. 4, FIG. 4 is a schematic diagram of a cross-sectional structure at position A-A in FIG. 3. The circuit board of this embodiment includes a first wiring board 31. The first wiring board 31 includes a first substrate 311 and a first wiring layer 312 disposed on a first side surface of the first substrate 311, and the first wiring layer 312 includes a first ground wiring. The circuit board further includes a first protective layer 71 and a first electromagnetic interference shielding layer 61 which are sequentially stacked on the side of the first wiring layer 312 away from the first substrate 311. The first protective layer 71 is provided with a first opening, wherein the first opening exposes at least a portion of the first ground wiring, the first opening is filled with a first conductive material 91, a height difference between a surface of the first conductive material 91 and a surface of the first protective layer 71 away from the first substrate 311 is from 0 micron to 2 microns (the height difference is 0 micron in the example of FIG. 4. That is, the surface of the first conductive material 91 is flush with the surface of the first protective layer 71 away from the first substrate 311), and the first conductive material 91 connects the first electromagnetic interference shielding layer 61 to the first ground wiring.

According to the circuit board of this embodiment, by the first conductive material 91 is filled in the first opening of the first protective layer 71 and the height difference between the surface of the first conductive material 91 and the surface of the first protective layer 71 away from the first substrate 311 is from 0 micron to 2 microns. In this way, the first conductive material 91 fills the segment difference at the first opening of the first protective layer 71, ensuring that the surface of the first protective layer 71 is flat and the thickness of the circuit board is not increased. After the first electromagnetic interference shielding layer 61 is attached to the first protective layer 71, the surface of the first electromagnetic interference shielding layer 61 may also be ensured to be flat. In addition, the first conductive material 91 fills the segment difference at the first opening of the first protective layer 71, and after the first electromagnetic interference shielding layer (EMI film in some examples) 61 is subsequently attached to the first protective layer 71, the stress balance of the circuit board (for example, when the circuit board at the first opening is a flexible circuit board) can be achieved at the first opening to prevent the circuit board from up-wrapping at the first opening.

In an example of this embodiment, the first conductive material 91 may be a metal material such as any one or more of gold, silver and copper. The first conductive material 91 may be filled within the first opening by an electroplating process or a coating process. For example, metal copper may be filled in the first opening by an electroplating process, or a point coating of silver paste may be made within the first opening by the coating process and the silver paste may be solidified. The first conductive material 91 is formed within the first opening by an electroplating process or a coating process, which may meet the filling requirements of different segment differences of different circuit boards, and the height difference between the surface of the first conductive material 91 and the surface of the first protective layer 71 away from the first substrate 311 may be ensured to be from 0 micron to 2 microns under the filling requirements of different segment differences, thus ensuring reliable connection between the first electromagnetic interference shielding layer 61 and the first ground wiring.

In an example of this embodiment, the first protective layer 71 may be provided with one or more first openings and the shape of the first openings may be rectangular, circular, polygonal, irregular, etc. The number and shape of the first openings is not limited in this embodiment. In some examples, the area in which the first opening is located is the ground area 221 in FIG. 3.

In an example of this embodiment, the first electromagnetic interference shielding layer 61 may be a first electromagnetic interference shielding film, which may include a protective film, and a shielding functional layer and a conductive adhesive layer which are sequentially stacked on a side surface of the protective film. The first electromagnetic interference shielding film can be attached to the first protective layer 71 and contacted with the first conductive material 91 by a hot pressing process, and the shielding functional layer is connected to the first conductive material 91 by a conductive adhesive layer, so that the shielding functional layer is connected to a first ground wiring.

In an example of this embodiment, the first protective layer 71 may include a first capping layer 712 and a first adhesive layer 711, wherein the first adhesive layer 711 is located between the first capping layer 712 and the first wiring layer 312, and the first capping layer 712 is adhered to the first wiring layer 312 through the first adhesive layer 711. A material of the first capping layer 712 may be polyimide and a material of the first adhesive layer 711 may be epoxy resin or acrylic. Illustratively, a process of forming the first protective layer 71 may include: a first covering film having a first opening is attached to a surface of a first wiring layer 312, the first covering film including a first capping layer 712 and a first adhesive layer 711 disposed on a side surface of the first capping layer 712, and the first covering film may be hot pressed on the first wiring layer 312 by a hot pressing process, during which the first adhesive layer 711 melts and adheres the first capping layer 712 to the first wiring layer 312. After the first protective layer 71 is formed, firstly, a first conductive material 91 is filled within the first opening to fill a segment difference at the first opening of the first protective layer 71. Then, a first electromagnetic interference shielding layer 61 is attached to the first protective layer 71 and the first conductive material 91.

In an example of this embodiment, a thickness of the first substrate 311 may be from 10 microns to 15 microns, e.g., 12.5 microns; a thickness of the first wiring layer 312 may be from 10 microns to 15 microns, e.g., 12 microns. The first protective layer 71 includes a first capping layer 712 and a first adhesive layer 711, a thickness of the first protective layer 71 may be from 25 microns to 35 microns, for example, a thickness of the first capping layer 712 is 12.5 microns. A thickness of the first adhesive layer from 711 is 20 microns, that is, the thickness of the first protective layer 71 is 32.5 microns, and then a thickness of the first conductive material 91 is from 30.5 microns to 34.5 microns, e.g., 32.5 microns, and a thickness of the first electromagnetic interference shielding layer 61 may be from 10 microns to 20 microns, e.g., 16 microns.

In some exemplary embodiments, as shown in FIG. 4, the first wiring board 31 may further include a second wiring layer 313 disposed on a second side surface of the first substrate 311, wherein the second wiring layer 313 includes a second ground wiring. The circuit board further includes a first insulating layer 51, a second electromagnetic interference shielding layer 62, and a conductive layer 81 which are sequentially stacked on a side of the second wiring layer 313 away from the first substrate 311. The first insulating layer 51 and the second electromagnetic interference shielding layer 62 are provided with a second opening (the second opening penetrates through the first insulating layer 51 and the second electromagnetic interference shielding layer 62), the second opening exposes at least a portion of the second ground wiring, a second conductive material 92 is filled within the second opening, a height difference between a surface of the second conductive material 92 and a surface of the second electromagnetic interference shielding layer 62 away from the first substrate 311 is from 0 micron to 2 microns (the height difference is 0 micron in the example of FIG. 4, that is, the surface of the second conductive material 92 is flush with the surface of the second electromagnetic interference shielding layer 62 away from the first substrate 311), and the second conductive material 92 connects the conductive layer 81 to the second ground wiring.

In an example of this embodiment, the second conductive material 92 may be a metal material such as any one or more of gold, silver and copper. The second conductive material 92 may be filled within the second opening by an electroplating process or a coating process. For example, metallic copper may be filled in the second opening by an electroplating process, or a point coating of silver paste may be made within the second opening by the coating process and the silver paste may be solidified. The second conductive material 92 is formed within the second opening by an electroplating process or a coating process, which may meet the filling requirements of different segment differences of different circuit boards, and the height difference between the surface of the second conductive material 92 and the surface of the second electromagnetic interference shielding layer 62 away from the first substrate 311 may be ensured to be from 0 micron to 2 microns under the filling requirements of different segment differences, thus ensuring reliable connection between the conductive layer 81 and the second ground wiring, achieving the grounding of the conductive layer 81.

In an example of this embodiment, a material of the first insulating layer 51 may be insulating ink, e.g., Photoimageable Solder Resist (PSR) ink. A material of the second electromagnetic interference shielding layer 62 may be a metal material, e.g., silver and the second electromagnetic interference shielding layer 62 may be formed by an electroplating process. A material of the conductive layer 81 may be a conductive adhesive. In another example, the first insulating layer 51 may be a covering film having the second opening, wherein the covering film includes an insulating film and an adhesive layer disposed on a side surface of the insulating film, and the covering film is pressed on a second wiring layer 313 through the adhesive layer.

In some exemplary embodiments, as shown in FIG. 3 and FIG. 4, the circuit board may include a main body portion 21 and a bendable portion 22 located on a first side of the main body portion 21. The main body portion 21 may include a plurality of stacked wiring boards. Each of the wiring boards includes a substrate and at least one wiring layer disposed on the substrate, and the plurality of wiring boards include a first wiring board 31, wherein the first wiring board 31 extends to the bendable portion 22, and the first protective layer 71, the first electromagnetic interference shielding layer 61 and the first opening are all located in the bendable portion 22.

In an example of this embodiment, the first substrate 311, the first wiring layer 312, and the second wiring layer 313 of the first wiring board 31 may all extend to the bendable portion 22. That is, both the main body portion 21 and the bendable portion 22 include the first wiring board 31. In an example of this embodiment, both the main body portion 21 and the bendable portion 22 may include the first insulating layer 51, the second electromagnetic interference shielding layer 62 and the conductive layer 81. The second opening may be located in the main body portion 21 or the bendable portion 22. The number of wiring layers of the bendable portion 22 is smaller than the number of wiring layers of the main body portion 21, and the number of the wiring layers of the bendable portion 22 is smaller so as to facilitate bending.

In an example of this embodiment, a thickness of the second wiring layer 313 may be from 15 microns to 25 microns, e.g., 21 microns. A thickness of the first insulating layer 51 may be from 20 microns to 30 microns, e.g., 25 microns. A thickness of the second electromagnetic interference shielding layer 62 may be from 10 microns to 20 microns, e.g., 16 microns. A total thickness of the first insulating layer 51 and the second electromagnetic interference shielding layer 62 is, for example, 41 microns, and a thickness of the second conductive material 92 is from 39 microns to 43 microns, e.g., 41 microns. A thickness of the conductive layer 81 of the main body portion 21 may be different from that of the conductive layer 81 of the bendable portion 22, for example, the thickness of the conductive layer 81 of the main body portion 21 may be from 100 microns to 200 microns, e.g., 150 microns, and the thickness of the conductive layer 81 of the bendable portion 22 may be from 20 microns to 40 micron, e.g., 30 microns.

In some exemplary embodiments, as shown in FIG. 4, the circuit board may further include a bonding portion 23 located on a second side of the main body portion 21 opposite to the first side. The plurality of wiring boards includes a second wiring board 32, wherein a second substrate 321 of the second wiring board 32 and at least one wiring layer extends to the bonding portion 23, and the wiring layer of the second wiring board 32 extending to the bonding portion 23 is provided with an exposed bonding pin (positions indicated by reference numeral 322 in FIG. 4), which is configured to be bonding-connected to an external circuit.

In an example of this embodiment, the bonding portion 23 may include a third wiring layer 322 (the third wiring layer 322 is a wiring layer of the second wiring board 32) and a second protective layer 72 which are sequentially stacked on a first side surface of the second substrate 321, wherein one end of the third wiring layer 322 away from the main body portion 21 is provided with the bonding pin, and the second protective layer 72 exposes the bonding pin, and the bonding portion 23 may further include a third protective layer 73 disposed on a second side surface of the second substrate 321.

In an example of this embodiment, the second protective layer 72 may include a second covering film 722 and a second adhesive layer 721, wherein the second adhesive layer 721 is located between the second covering film 722 and the third wiring layer 322. The third protective layer 73 may include a third capping layer 732 and a third adhesive layer 731, wherein the third adhesive layer 731 is located between the third capping layer 732 and the second substrate 321. Materials of the second capping layer 722 and the third capping layer 732 may all be polyimide. Materials of the second adhesive layer 721 and the third adhesive layer 731 may be epoxy resin or acrylic. Illustratively, formation processes of the second protective layer 72 and the third protective layer 73 may be the same, and the following is described by taking the formation process of the second protective layer 72 as an example. A second covering film having a third opening is attached to a surface of the third wiring layer 322, wherein the second covering film includes a second capping layer 722 and a second adhesive layer 721 disposed on a side surface of the second capping layer 722. The second covering film may be hot pressed on the third wiring layer 322 using a hot pressing process during which the second adhesive layer 721 melts and adheres the second covering film 722 to the third wiring layer 322, and the third opening exposes the bonding pin of the third wiring layer 322.

In an example of this embodiment, a thickness of the second substrate 321 may be from 10 microns to 30 microns, e.g., micron. A thickness of the third wiring layer 322 may be from 10 microns to 20 microns, e.g., 16 microns. The second protective layer 72 includes a second covering film 722 and a second adhesive layer 721, a thickness of the second protective layer 72 may be from 25 microns to 35 microns, and for example, a thickness of the second covering film 722 is 12.5 microns and a thickness of the second adhesive layer 721 is 20 micron, and the third protective layer 73 includes a third capping layer 732 and a third adhesive layer 731, a thickness of the third protective layer 73 may be from 25 microns to 35 microns, for example, a thickness of the third capping layer 732 is 12.5 microns and the thickness of the third adhesive layer 731 is 20 microns.

In some exemplary embodiments, as shown in FIG. 4, the plurality of wiring boards may further include a third wiring board 33, the first wiring board 31, the second wiring board 32 and the third wiring board 33 may be sequentially stacked, two adjacent wiring boards are adhered by an adhesive layer, and a first side surface of the first substrate 311 on which the first wiring layer 312 is provided is disposed facing the second wiring board 32. A side surface of the second substrate 321 on which a third wiring layer 322 is provided may be disposed facing the first wiring board 31. Here, within the main body 21, the first wiring board 31 and the second wiring board 32 may be adhered by a first adhesive layer 41, and the third wiring board 33 and the second wiring board 32 may be adhered by a second adhesive layer 42.

In an example of this embodiment, the second wiring board 32 within the main body portion 21 may include a third wiring layer 322 and a fourth wiring layer 323 respectively disposed on two side surfaces of the second substrate 321, the third wiring layer 322 may be located on a first side surface of the second substrate 321 facing the first wiring board 31, and the fourth wiring layer 323 may be located on a second side surface of the second substrate 321 facing the third wiring board 33. A first wiring layer 312 of the first wiring board 31 is located on a first side surface of the first substrate 311 facing the second wiring board 32, and a second wiring layer 313 of the first wiring board 31 is located on a second side of the first substrate 311 facing away from the second wiring board 32. The third wiring board 33 includes a third substrate 331, and a fifth wiring layer 332 and a sixth wiring layer 333 respectively disposed on two side surfaces of the third substrate 331, wherein the fifth wiring layer 332 may be located on a first side surface of the third substrate 331 facing the second wiring board 32, and the sixth wiring layer 333 may be located on a second side surface of the third substrate 331 facing away from the second wiring board 32. In this example, the first adhesive layer 41 may be adhered between the first wiring layer 312 of the first wiring board 31 and the third wiring layer 322 of the second wiring board 32, and the second adhesive layer 42 may be adhered between the fourth wiring layer 323 of the second wiring board 32 and the fifth wiring layer 332 of the third wiring board 33. The number of wiring layers in the main body portion 21 of the circuit board of this example is six, and each of the three wiring boards includes a substrate and two wiring layers respectively disposed on two side surfaces of the substrate. In other examples, the number of wiring layers of the main body portion 21 may be designed as required, for example three layers, four layers or the like. The material of the substrate of each of the three wiring boards may be polyimide, polyether ether ketone or polyester, and a material of each wiring layer may be copper. In some examples, a forming process of each wiring board may include: providing a base material including an insulating substrate and a copper layer covering each of two surfaces of the insulating substrate (an adhesive layer or no adhesive layer may be provided between the insulating substrate and the copper layer), wherein if a thickness of the copper layer of the base material cannot reach a thickness of required wiring layer, a copper layer of a certain thickness may be electroplated on the copper layer of the base material; applying processes of exposure, development and etching, etc., to the copper layers on the two surfaces to form the required wiring layer.

In an example of this embodiment, the main body portion 21 may further include a second insulating layer 52 and a third electromagnetic interference shielding layer 63 which are sequentially stacked on a side of the third wiring board 33 away from the second wiring board 32. The second insulating layer 52 may be disposed on a sixth wiring layer 333 of the third wiring board 33, and the material of the second insulating layer 52 may be insulating ink, for example, PSR ink. In other examples, the second insulating layer 52 may be a covering film, wherein the covering film includes an insulating film, and an adhesive layer disposed on a side surface of the insulating film, and the covering film is pressed on the sixth wiring layer 333 through the adhesive layer. The third electromagnetic interference shielding layer 63 and the first electromagnetic interference shielding layer 61 may be integrally connected, for example, the third electromagnetic interference shielding layer 63 and the first electromagnetic interference shielding layer 61 are the same electromagnetic interference shielding film, the electromagnetic interference shielding film is attached to the main body portion 21 and the bendable portion 22, or the third electromagnetic interference shielding layer 63 and the first electromagnetic interference shielding layer 61 are of a same metal material and may be simultaneously formed on the main body portion 21 and the bendable portion 22 by a same electroplating process. As shown in FIG. 4, a surface of the circuit board adjacent to the third wiring board 33 has a segment difference with a certain height between the main body portion 21 and the bendable portion 22, wherein a part of the main body portion 21 protruding from the bendable portion 22 includes a plurality of wiring layers of the second wiring board 32 and the third wiring board 33, and end faces of the plurality of wiring layers adjacent to the bendable portion 22 are seen as exposed in FIG. 4, but in an actual manufacturing process of the circuit board, in a process of forming an insulating layer on the surface of the wiring layer and in a process of adhering adjacent circuit boards by using adhesive layers, a part of the material forming the insulating layer and the adhesive layer overflows the edge of the wiring board so as to cover the end faces of the plurality of wiring layers adjacent to the bendable portion 22, so that the third electromagnetic interference shielding layer 63 and the first electromagnetic interference shielding layer 61 formed subsequently do not contact the end faces of the plurality of wiring layers near the bendable portion 22.

In an example of this embodiment, a thickness of the fourth wiring layer 323 may be from 10 microns to 20 microns, e.g., microns. A thickness of the third substrate 331 may be from 10 microns to 15 microns, e.g., 12.5 microns. A thickness of the fifth wiring layer 332 may be from 10 microns to 20 microns, e.g., 12 microns. A thickness of the sixth wiring layer 333 may be from 15 microns to 25 microns, e.g., 21 microns. A thickness of the second insulating layer 52 may be from 20 microns to 30 micron, e.g., 25 microns. A thickness of the third electromagnetic interference shielding layer 63 may be from 10 microns to 20 microns, e.g., 16 microns. A thickness of the first adhesive layer 41 may be from 30 microns to 50 microns, e.g., 40 microns. A thickness of the second adhesive layer 42 may be from 30 microns to 50 microns, e.g., 40 microns.

The circuit board of the embodiment of the present disclosure may be applied to a variety of display modules (for example, an OLED display module, an LCD display module, etc.). The circuit board may include a display circuit, and may further include a touch circuit, wherein the display circuit and the touch circuit may be disposed in different wiring layers. The circuit board is bonding-connected to a display panel of the display module through the bonding portion 23, and the bendable portion 22 of the circuit board may be bent to the back of the display panel and fixed to the back of the display panel.

An embodiment of the present disclosure further provides an electronic device, including the circuit board as described above by any of the embodiments. The electronic device may be display apparatus, such as product or component with a display function like a mobile phone, a tablet computer, a television, a display, laptop, a digital photo frame, or a navigator, etc. In some examples, the electronic device may be a touch display apparatus.

In the accompanying drawings, the size of a constituent element, and the thickness of a layer or an area are sometimes exaggerated for clarity. Therefore, one implementation of the present disclosure is not necessarily limited to the size, and the shape and size of each component in the drawings do not reflect the actual scale. In addition, the drawings schematically illustrate some examples, and one implementation of the present disclosure is not limited to the shapes or numerical values shown in the drawings.

In the description herein, orientation or position relationships indicated by the terms such as "upper", "lower", "left", "right", "top", "inside", "outside", "axial", "tetragonal" and the like are orientation or position relationships shown in the drawings, and are intended to facilitate description of the embodiments of the present disclosure and simplification of the description, but not to indicate or imply that the mentioned structure has a specific orientation or be constructed and operated in a specific orientation, therefore, they should not be understood as limitations on the present disclosure.

In the description herein, unless otherwise specified and defined explicitly, the terms "connection", "fixed connection", "installation" and "assembly" should be understood in a broad sense, and, for example, may be a fixed connection, a detachable connection or an integrated connection; the terms "installation", "connection" and "fixed connection" may be a direct connection, an indirect connection through intermediate components, or communication inside two components. For those ordinarily skilled in the art, meanings of the above terms in the embodiments of the present disclosure can be understood according to situations.

The invention claimed is:

1. A circuit board, comprising a first wiring board, wherein the first wiring board comprises a first substrate and a first wiring layer disposed on a first side surface of the first substrate, and the first wiring layer comprises a first ground wiring; the circuit board further comprises a first protective layer and a first electromagnetic interference shielding layer which are sequentially stacked on a side of the first wiring layer away from the first substrate; and the first protective layer is provided with a first opening, wherein the first opening exposes at least a portion of the first ground wiring and is filled with a first conductive material, and a height difference between a surface of the first conductive material and a surface of the first protective layer away from the first substrate is from 0 micron to 2 microns, and the first conductive material connects the first electromagnetic interference shielding layer to the first ground wiring; and wherein the first wiring board further comprises a second wiring layer disposed on a second side surface of the first substrate, and the second wiring layer comprises a second ground wiring; the circuit board further comprises a first insulating layer, a second electromagnetic interference shielding layer and a conductive layer which are sequentially stacked on a side of the second wiring layer away from the first substrate; and the first insulating layer and the second electromagnetic interference shielding layer are provided with a second opening, wherein the second opening exposes at least a portion of the second ground wiring and is filled with a second conductive material, wherein a height difference between a surface of the second conductive material and a surface of the second electromagnetic interference shielding layer away from the first substrate is from 0 micron to 2 microns, and the second conductive material connects the conductive layer to the second ground wiring.

2. The circuit board according to claim 1, wherein the second conductive material is a metal material, or/and a material of the conductive layer is a conductive adhesive.

3. The circuit board according to claim 1, wherein the first conductive material is a metal material.

4. The circuit board according to claim 1, wherein the first protective layer comprises a first capping layer and a first adhesive layer, and the first adhesive layer is located between the first capping layer and the first wiring layer.

5. The circuit board according to claim 1, comprising a main body portion and a bendable portion located on a first side of the main body portion, wherein the main body portion comprises a plurality of wiring boards which are stacked, each of the wiring boards comprises a substrate and at least one wiring layer disposed on the substrate, and the plurality of wiring boards comprise the first wiring board, and the first wiring board extends to the bendable portion; and
    the first protective layer, the first electromagnetic interference shielding layer and the first opening are all located in the bendable portion.

6. The circuit board according to claim 5, wherein both the main body portion and the bendable portion comprise the first insulating layer, the second electromagnetic interference shielding layer and the conductive layer, and the second opening is located in the main body portion.

7. The circuit board according to claim 5, further comprising a bonding portion located on a second side of the main body portion opposite to the first side; and
    the plurality of wiring boards comprise a second wiring board, wherein a second substrate of the second wiring board and at least one wiring layer extend to the bonding portion, and the wiring layer of the second wiring board extending to the bonding portion is provided with an exposed bonding pin configured to be bonding-connected to an external circuit.

8. The circuit board according to claim 7, wherein the bonding portion comprises a third wiring layer and a second protective layer which are sequentially stacked on a first side of the second substrate, wherein an end of the third wiring layer away from the main body portion is provided with the bonding pin, and the second protective layer exposes the bonding pin, and the bonding portion further comprises a third protective layer disposed on a second side surface of the second substrate.

9. The circuit board according to claim 8, wherein the second protective layer comprises a second capping layer and a second adhesive layer, the second adhesive layer is located between the second capping layer and the third wiring layer; or/and, the third protective layer comprises a third capping layer and a third adhesive layer, and the third adhesive layer is located between the third capping layer and the second substrate.

10. The circuit board according to claim 7, wherein the plurality of wiring boards further comprises a third wiring board, the first wiring board, the second wiring board and the third wiring board are sequentially stacked, two adjacent wiring boards are adhered by an adhesive layer, and the first side surface of the first substrate is disposed facing the second wiring board.

11. The circuit board according to claim 10, wherein the second wiring board within the main body portion comprises a third wiring layer and a fourth wiring layer respectively disposed on two side surfaces of the second substrate, and the third circuit board comprises a third substrate and a fifth wiring layer and a sixth wiring layer respectively disposed on two side surfaces of the third substrate; and the main body portion further comprises a second insulating layer and a third electromagnetic interference shielding layer which are sequentially stacked on a side of the third wiring board away from the second wiring board, and the third electromagnetic interference shielding layer and the first electromagnetic interference shielding layer are integrally connected.

12. An electronic device, comprising the circuit board according to claim 1.

* * * * *